United States Patent
Chen et al.

(10) Patent No.: US 10,515,861 B2
(45) Date of Patent: Dec. 24, 2019

(54) METHOD FOR CALIBRATING TEMPERATURE IN CHEMICAL VAPOR DEPOSITION

(71) Applicant: Taiwan Semiconductor Manufacturing Co., Ltd., Hsin-Chu (TW)

(72) Inventors: Chih-Fen Chen, Taoyuan (TW); Tsung-Ying Liu, Hsin-Chu (TW); Yeh-Hsun Fang, Hsin-Chu (TW); Bang-Yu Huang, Zhubei (TW); Chui-Ya Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/940,357

(22) Filed: Mar. 29, 2018

(65) Prior Publication Data

US 2019/0035697 A1 Jan. 31, 2019

Related U.S. Application Data

(60) Provisional application No. 62/538,336, filed on Jul. 28, 2017.

(51) Int. Cl.
*H01L 21/02* (2006.01)
*H01L 21/66* (2006.01)
(Continued)

(52) U.S. Cl.
CPC .......... *H01L 22/20* (2013.01); *C23C 16/0227* (2013.01); *C23C 16/24* (2013.01);
(Continued)

(58) Field of Classification Search
CPC ... H01L 21/02; H01L 21/306; H01L 21/0262; H01L 21/02532; H01L 21/02658; H01L 21/30604; H01L 21/66; H01L 21/223; H01L 21/225; H01L 21/762; H01L 21/02129; H01L 21/2255; H01L 27/146; H01L 27/1463; H01L 27/1464;
(Continued)

(56) References Cited

U.S. PATENT DOCUMENTS

| | | | |
|---|---|---|---|
| 2007/0252085 A1* | 11/2007 | Stiens | ........................ G01J 1/02 250/338.4 |
| 2014/0151778 A1* | 6/2014 | Purayath | ........... H01L 21/28273 257/316 |
| 2019/0013390 A1* | 1/2019 | Cheng | ................. H01L 29/4991 |

\* cited by examiner

*Primary Examiner* — Chuong A Luu
(74) *Attorney, Agent, or Firm* — Duane Morris LLP

(57) ABSTRACT

In a method for semiconductor processing, a semiconductor substrate is provided. The semiconductor substrate defines at least one first trench therein. The at least one first trench has a first depth ($d_1$). A coating layer is deposited onto the semiconductor substrate using at least one precursor under a setting for a processing temperature (T). The coating layer defines at least one second trench having a second depth ($d_2$) above the at least one first trench. A depth parameter (t) the second depth ($d_2$) relative to the first depth ($d_1$) is determined. The processing temperature (T) is then determined based on a pre-determined standard reference curve comprising a plurality of references depth parameters in a first range as a function of a plurality of reference processing temperatures in a second range.

20 Claims, 8 Drawing Sheets

(51) Int. Cl.
     *C30B 29/06*     (2006.01)
     *C30B 25/16*     (2006.01)
     *C23C 16/02*     (2006.01)
     *H01L 21/306*     (2006.01)
     *C23C 16/52*     (2006.01)
     *C23C 16/24*     (2006.01)

(52) U.S. Cl.
     CPC .............. *C23C 16/52* (2013.01); *C30B 25/16* (2013.01); *C30B 29/06* (2013.01); *H01L 21/30604* (2013.01); *H01L 21/0262* (2013.01); *H01L 21/02532* (2013.01); *H01L 21/02658* (2013.01)

(58) Field of Classification Search
     CPC ......... H01L 27/14621; H01L 27/14627; H01L 27/14636; H01L 27/14685
     USPC ............................................................ 438/5
     See application file for complete search history.

METHOD FOR CALIBRATING TEMPERATURE IN CHEMICAL VAPOR DEPOSITION

PRIORITY CLAIM AND CROSS-REFERENCE

This application claims the benefit of U.S. Provisional Application No. 62/538,336, filed Jul. 28, 2017, which application is expressly incorporated by reference herein in its entirety.

BACKGROUND

As semiconductor devices are scaled to smaller sizes, new materials and concepts are being considered to meet advanced performance targets. Processing conditions at each step are also extremely important for controlling the quality of the semiconductor devices.

Chemical vapor deposition (CVD) is a process for forming stable solids by decomposition of gaseous chemical using heat, plasma, ultraviolet, or other energy sources, or combinations thereof. Reactant gases are passed over a wafer, causing CVD of a thin layer of the reactant material on the wafer. For example, epitaxial growth of silicon can be achieved by CVD using heat as the energy source for decomposing one or more gaseous chemicals. The temperature in the CVD process can affect growth rate and morphology of the deposited product. Various process conditions, e.g. temperature uniformity and reactant gas distribution, must be carefully controlled to ensure high quality of the deposited layers and resulting semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1:
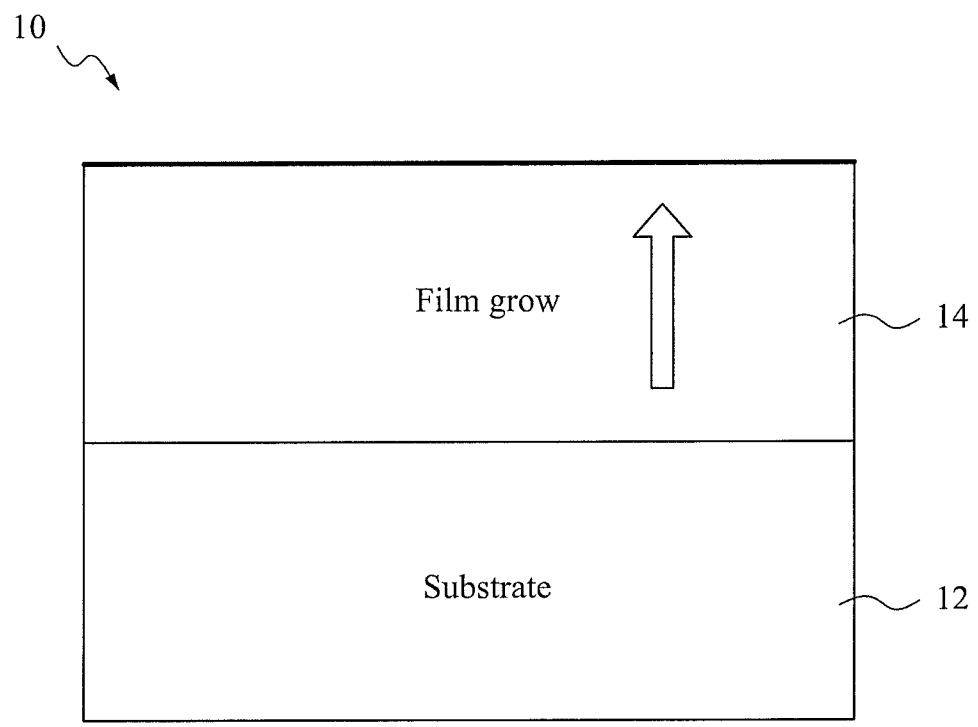
FIG. 1 is a cross-sectional view illustrating a portion of an exemplary device comprising a coating layer disposed on a semiconductor substrate in some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a nano structure" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Referring to FIG. 1, an exemplary device 10 comprises a semiconductor substrate 12 and a coating layer 14 disposed on the semiconductor substrate 12. The semiconductor substrate 12 is a wafer comprising a semiconductor material, and optionally includes transistors and other components being fabricated. Examples of suitable materials for substrate 12 include, but are not limited to, silicon, germanium, a compound semiconductor, and a semiconductor-on-insulator (SOI) substrate. A compound semiconductor can be an III-V semiconductor compound such as gallium arsenide (GaAs). An SOI substrate can comprise a semiconductor on an insulator such as glass. The semiconductor substrate 12 can be a wafer of any size (e.g., 300 mm in diameter).

In some embodiments, the coating layer 14 may be formed through a chemical vapor deposition (CVD) process using one or more gaseous precursors, which are decomposed under heat to provide a thin layer of a solid material for the coating layer 14. In some embodiments, the coating layer 14 comprises silicon, for example, single crystalline or polycrystalline silicon. Epitaxial growth of silicon is achieved through heat-activated CVD using at least one silicon-containing precursor. Examples of a suitable silicon-containing precursor include, but are not limited to silane ($SiH_4$), trichlorosilane (TCS), methylsilane, disilane, trisilane, and combination thereof. A reducing reactant such as hydrogen gas may be used. For example, in some embodiments, a gas stream, which comprises a mixture of trichlorosilane and hydrogen is introduced into a processing chamber, inside of which the semiconductor substrate 12 is placed. The gas stream, after being heated, reacts to deposit silicon on the semiconductor substrate 12. The reaction of the trichlorosilane and hydrogen may be illustrated by the following simplified formula:

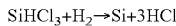

$$SiHCl_3 + H_2 \rightarrow Si + 3HCl$$

In such a CVD process, the temperature can affect growth rate and morphology of the deposited product such as silicon. For example, depending on the temperature, the resulting product may be amorphous, polycrystalline, or single crystalline silicon. The processing parameters including a setting for a targeted temperature may be empirically controlled. The actual processing temperatures are not calibrated and controlled. The actual processing temperature may also be calibrated by measuring the thickness of the coating layer 14. However, several factors affect the thickness of the coating layer 14. For example, temperature and deposition time are two key factors. According to the inventors' studies, temperature and deposition time may have contribution factors in a ratio in a range of from 3:1 to 4:1. In another word, temperature has an effect on the thickness of the coat layer 14 as three to four times as high as that of the deposition time. For one example, the temperature effect on the coating thickness is about 3.6 as high as the effect of the deposition time on the coating thickness. Overall the thickness of the coating layer 14 is very sensitive to both temperature and deposition time. The effects of temperature and deposition time may not be effectively distinguished.

The inventors have determined the actual processing temperature inside the processing chamber during a CVD process is one factor in determining the quality of the deposited product. Thus, in some embodiments, the actual processing temperature and temperature uniformity are controlled to ensure high quality of the coating layer 14 (e.g., silicon) and resulting semiconductor devices.

Figure 2A:
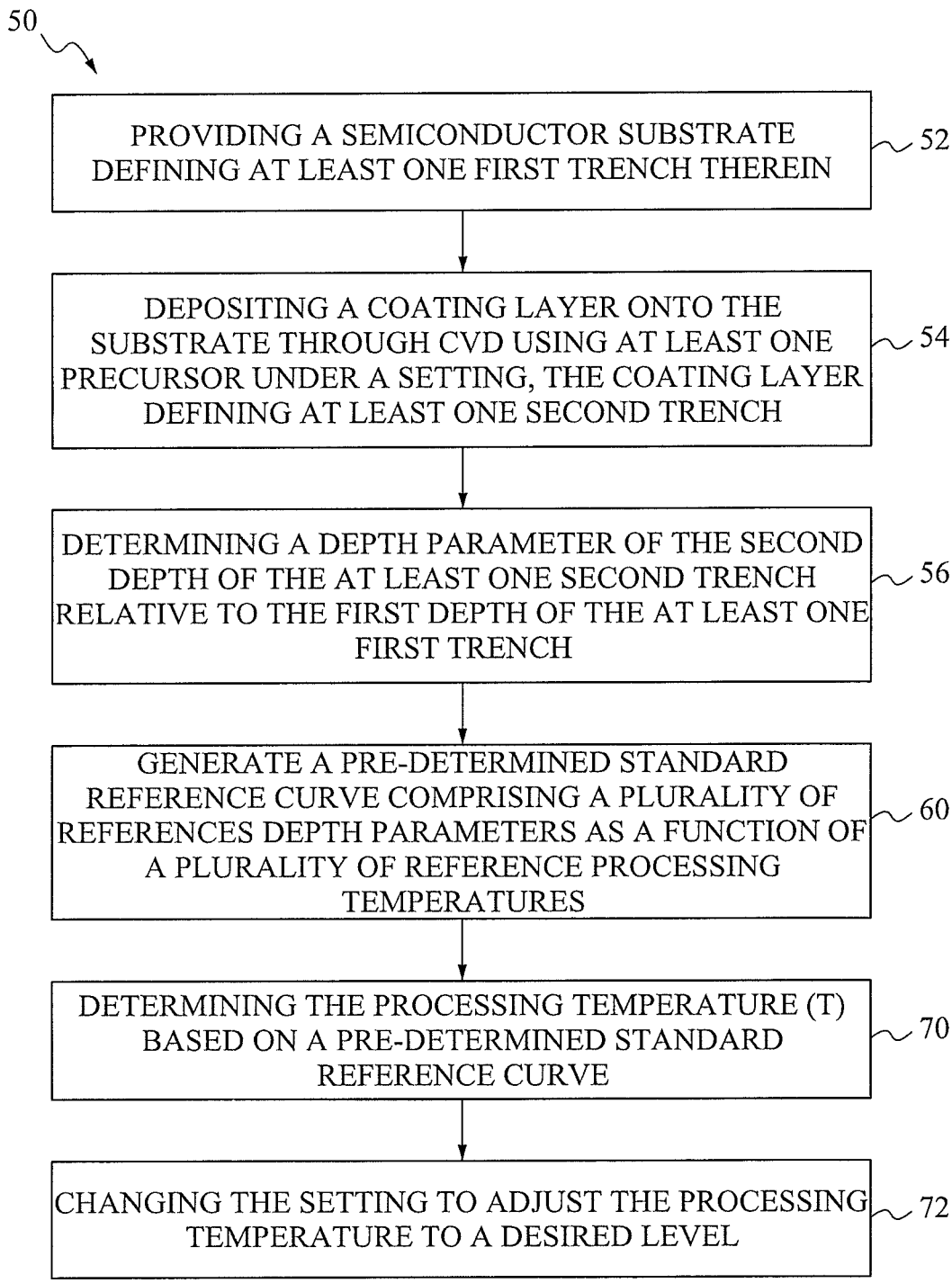
FIG. 2A is a flow chart illustrating an exemplary method for calibrating and adjusting temperature in a processing chamber for making a coating layer in accordance with some embodiments
Figure 2B:
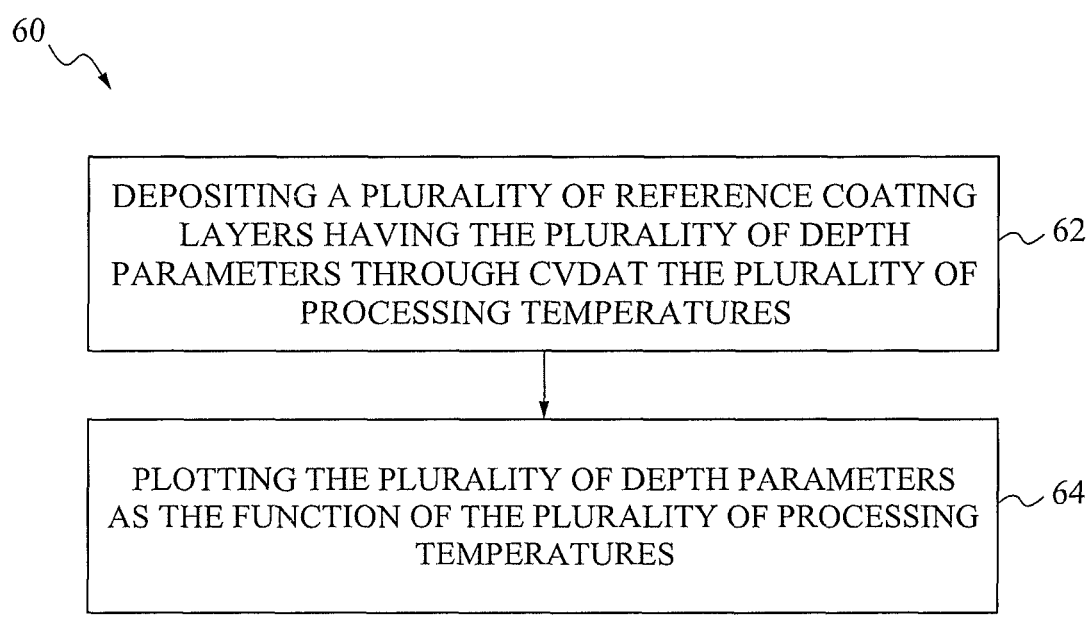
FIG. 2B is a flow chart illustrating an exemplary method for generating a pre-determined standard reference curve in accordance with some embodiments.

In accordance with various embodiments, the present disclosure provides a method for semiconductor processing, particularly a method for calibrating and/or controlling the actual processing temperature in a CVD process, or any other coating process. The methods described in FIGS. 2A-2B are described with reference to the exemplary structure described in FIGS. 3-7. In FIGS. 3-7, like items are indicated by like reference numerals, and for brevity, descriptions of the structure, provided above with reference to the preceding drawings are not repeated.

Figure 3:
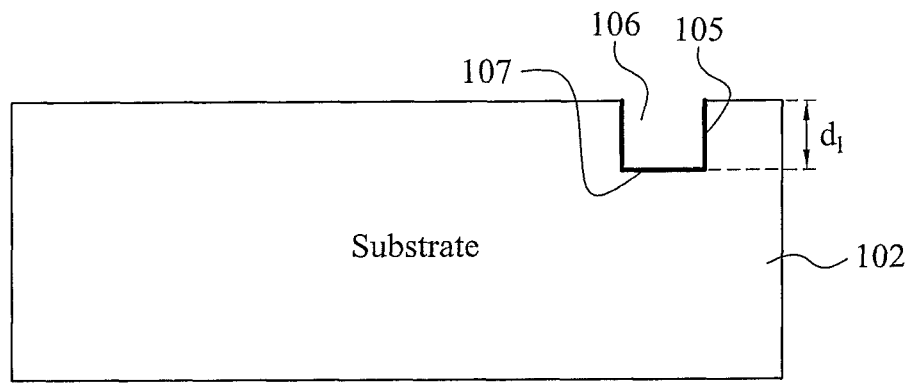
FIG. 3 is a cross-sectional view illustrating a portion of an exemplary semiconductor substrate defining at least one trench therein in some embodiments.

Referring to FIG. 2A, an exemplary method 50 can be used for calibrating and/or controlling temperature in a processing chamber in accordance with some embodiments. At process (or step) 52, a semiconductor substrate 102 is provided. An exemplary semiconductor substrate 102 is illustrated in FIG. 3. The semiconductor substrate 102 can be the same as the semiconductor substrate 12 described above, except that the semiconductor substrate 102 defines at least one first trench 106 (FIG. 3) therein. The semiconductor substrate 102 can be a test piece before a process of fabrication of a semiconductor device, or a wafer (i.e. a working wafer) on which semiconductor devices are built. If it is a working wafer, the at least one first trench 106 may be near the edges. The at least one first trench 106 has side walls 105 and a bottom wall 107. The at least one first trench 106 may have a first depth ($d_1$). The at least one first trench 106 can be formed using any suitable method. For example, the semiconductor substrate 102 can be patterned using photoresist and then etched using either a wet method or a dry method (e.g., using plasma) to form the at least one first trench 106. The dimensions of the at least one first trench 106 including the first depth ($d_1$) can be measured and recorded. In some embodiments, the at least one first trench 106 has a width in a range of from about 5 microns to about 20 microns (e.g., from 7 microns to 10 microns), and the first depth in a range of from about 50 nanometers to about 300 nanometers (e.g., from 100 nm to 200 nm).

Figure 4:
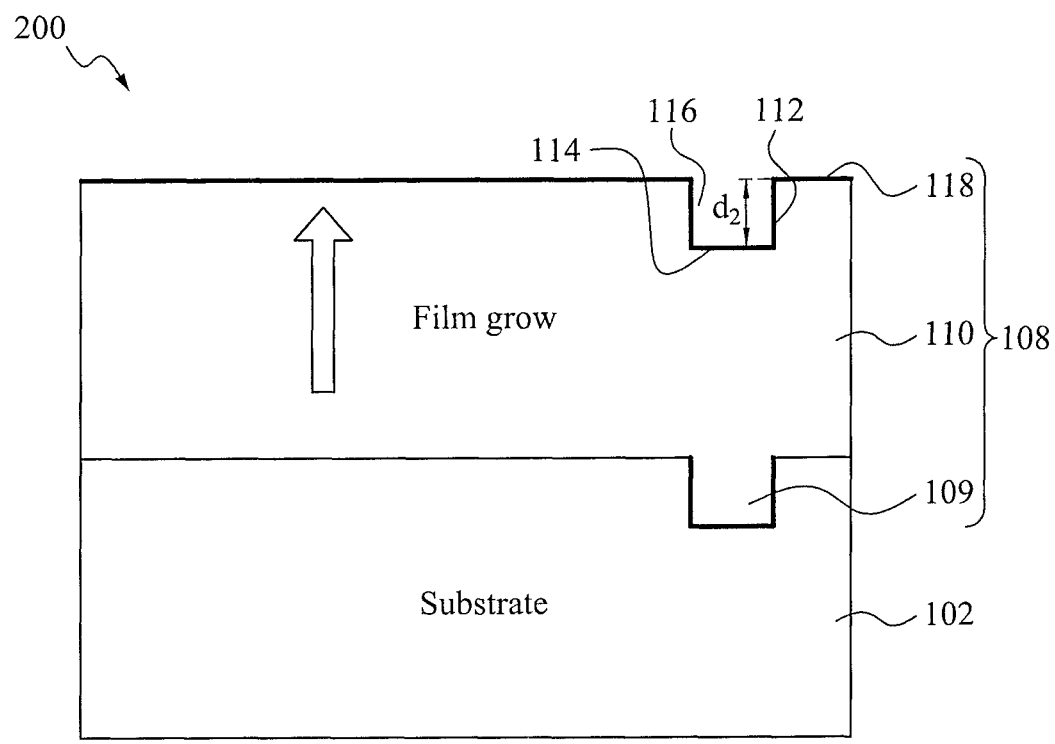
FIG. 4 is a cross-sectional view illustrating an exemplary structure with a coating layer disposed on the semiconductor substrate of FIG. 3 in accordance with some embodiments.

At process 54, a coating layer 108 is deposited onto the semiconductor substrate 102 through chemical vapor deposition (CVD) using at least one precursor under a setting for a processing temperature (T). The resulting structure 200 is illustrated in FIG. 4. The coating layer 108 is the same as the coating layer 14 as described above, except the shape due to the at least one first trench 106. In some embodiments, the coating layer 108 comprises silicon, for example, single crystalline or polycrystalline silicon. The coating layer 108 may fill the at least one first trench 106, and conformally formed above the semiconductor substrate 102. The coating layer 108 defines at least one second trench 116 having a second depth ($d_2$) above the at least one first trench 106. Based on the location relative to the at least one first trench 106, the coating layer 108 can be categorized into at least two portions, including a first portion 109 inside the at least one first trench 106, and the second portion 110 above the semiconductor substrate 102. As illustrated in FIG. 4, the at least one second trench 116 has side walls 112 and a bottom wall 114. The at least one second trench 116 may have a second depth ($d_2$). The second portion 110 of the coating layer 108 also includes a shoulder portion 118 above the bottom wall 114. As illustrated in FIG. 4, the shoulder portion 118 is the portion of the coating layer 108

In some embodiments, the coating layer 108 comprises silicon (e.g., single crystalline) formed through epitaxial growth. Epitaxial growth of silicon is achieved through heat-activated CVD using at least one silicon-containing precursor in some embodiments. The at least one precursor may comprise any suitable chemicals including at least one silicon-containing precursor. For example, in some embodiments, the at least one precursor comprises trichlorosilane (TCS) and hydrogen. The CVD process is performed in an elevated temperature in a suitable range, for example, from about 1,000° C. to about 1,500° C. (e.g., 1,100° C.-1,200° C.). The flow rate of TCS may be in any suitable range, for example, from about 10,000 sccm to about 20,000 sccm. Hydrogen is a reactant and also a carrier gas. Gas pressure inside the processing chamber may be in any suitable range. In some embodiments, the gas pressure inside the processing chamber is about 1 atmosphere pressure.

The dimension of the at least one second trench 116 including the second depth ($d_2$) may be measured and recorded offline after the CVD process or inline during the CVD process. In some embodiments, the at least one second trench 116 has a width in a range of from about 5 microns to about 20 microns (e.g., from 7 microns to 10 microns), and the second depth in a range of from about 50 nanometers to about 300 nanometers (e.g., from 100 nm to 200 nm). The coating layer 108 may have a thickness in a range from about 5 microns to about 50 microns (e.g., from 5 microns to about 10 microns).

The inventors have determined that processing temperature is a primary or dominating factor in determining the second depth ($d_2$) of the at least one second trench 116 relative to the first depth ($d_1$) of the at least first trench 106. However, in some embodiments, to keep a consistent temperature calibration, the coating layer 108 may be deposited onto the semiconductor substrate 102 under the same other conditions in each experiment. For example, the coating layer may be deposited at a fixed gas pressure inside a processing chamber, and a fixed feeding rate of the at least one precursor for a fixed period of time.

Figure 5:
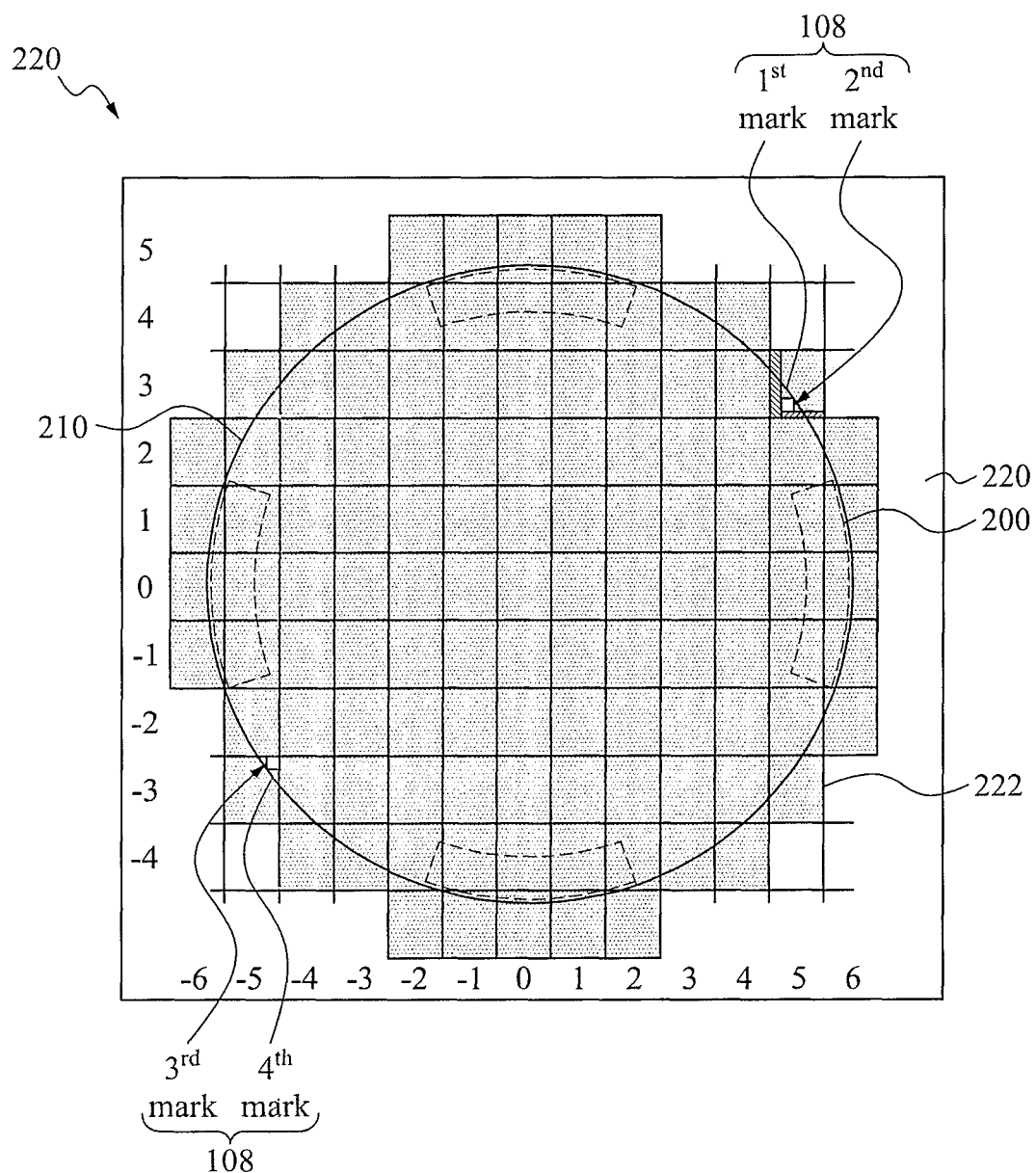
FIG. 5 is a plan view illustrating exemplary locations of trenches on a semiconductor substrate in some embodiments.

Referring to FIG. 5, exemplary locations of trenches 106 and 116 on a semiconductor substrate 102 are illustrated. In some embodiments, the semiconductor substrate 102 is a testing wafer (or called control wafer), which may be recycled and reused. In some other embodiments, the semiconductor substrate 102 may be a wafer having transistors and devices being fabricated thereon. In either of these embodiments, the at least one first trench 106 may be formed in any location of the wafer. For example, the at least one first trench 106 may be formed in areas close or adjacent to the edge 210 of the semiconductor substrate 102. The at least one first trench 106 may be formed in at least two areas across the semiconductor substrate 102 (FIG. 5), or in multiple (e.g., 3, 4, 5, or 6) locations uniformly distributed along the edge 210 of the semiconductor substrate 102. In some embodiments, the at least one first trench 106 may also be formed in the middle of the semiconductor substrate 102. FIG. 5 only illustrates two exemplary locations for two of the first trenches 106 and the resulting coating layer 108 having two of the second trenches 116 above the first trenches 106. The structure 200 including the semiconductor substrate 102 is projected with a view panel 220 having grid lines 222 for visual examination purpose only. Each respective area may be marked on the view panel 220 by at least two marks to show the resulting coating layer 108 with a second trench 116 above two of the first trenches 106.

Figure 6:
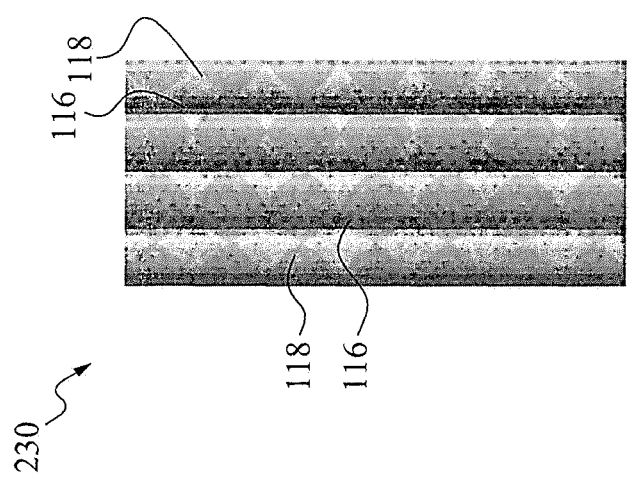
FIG. 6 is a plan view illustrating a plurality of trenches on a semiconductor substrate in some embodiments.

Referring to FIG. 6, a plurality of first trenches 106, and the coating layer 108 having a plurality of second trenches 116, may be formed on the semiconductor substrate 102 in some embodiments. The semiconductor substrate 102 can be etched to define a plurality (e.g., 2, 3, 4, 5, 6) of first trenches 106, which may be parallel to each other. The plurality of first trenches may have similar or identical dimensions including length, width and depth. For example, each of the plurality of trenches 106 may have a width in a range of from about 5 microns to about 20 microns (e.g., from 7 microns to 10 microns), and a depth in a range of from about 50 nanometers to about 300 nanometers (e.g., from 100 nm to 200 nm). The plurality of first trenches 106 and the plurality of second trenches 116 are used for generating a plurality data points for an average value in determining actual temperatures inside the processing chamber.

After processes 52 and 54, the data including the first depth ($d_1$) and the second depth ($d_2$) can be collected and treated to determine the actual processing temperature during the CVD process in process 56.

At process 56 of FIG. 2A, a depth parameter (t) of the second depth ($d_2$) relative to the first depth ($d_1$) is determined. Unless expressly indicated otherwise, references to "a depth parameter (t) of the second depth ($d_2$) relative to the first depth ($d_1$)" made herein will be understood to encompass any relative value derived from $d_1$ and $d_2$, for example, a difference ($d_2$–$d_1$), a ratio ($d_2/d_1$), or only $d_2$ when $d_1$ is a fixed constant in all experiments.

In some embodiments, the depth parameter (t) is the difference between the second depth ($d_2$) and the first depth ($d_1$). Alternatively, the depth parameter (t) may be represented by the second depth ($d_2$), wherein the first depth ($d_1$) is a fixed value.

Figure 7:
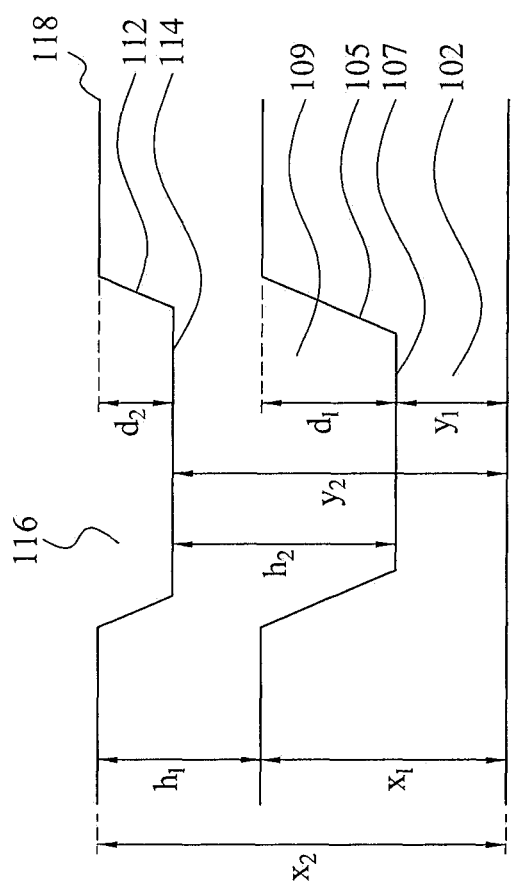
FIG. 7 is a cross-sectional view illustrating the exemplary structure of FIG. 4 with different dimension symbols.

When the depth parameter (t) is the difference between the second depth ($d_2$) and the first depth ($d_1$), such a difference also represents the relative tendency for depositing coating layer 108 above and inside the at least one first trench 106. Referring to FIG. 7, different dimension parameters are marked. Symbol $x_1$ represents the thickness of substrate 102 before a coating process. Symbol $y_1$ is the dimension from the bottom surface of trench 106 to a bottom surface of substrate 102. Symbol $x_2$ represents the overall thickness at the shoulder portion 118 of coating layer 108. Symbol $y_2$ is the dimension from the bottom surface of trench 116 to a bottom surface of substrate 102. Symbol $h_1$ represents the coating thickness of the coating layer 108 at the shoulder portion of 118. Symbol $h_2$ represents the coating thickness of the coating layer 108 at the trench portion of 109.

The relationship among these parameters can be illustrated in the following equations:

$$d_1 = x_1 - y_1$$

$$d_2 = x_2 - y_2$$

$$h_1 = x_2 - x_1$$

$$h_2 = y_2 - y_1$$

$$t = d_2 - d_1 = (x_2 - y_2) - (x_1 - y_1) = (x_2 - x_1) - (y_2 - y_1) = h_1 - h_2$$

Therefore, the depth parameter (t), which is the difference between the second depth ($d_2$) and the first depth ($d_1$), also represent the difference between the coating thickness the shoulder portion of 118 ($h_1$) and the coating thickness in the trench portion 109 ($h_2$) of the coating layer 108.

The inventors have determined that the actual processing temperature inside a processing chamber is the dominating factor for the depth parameter (t) of the second depth ($d_2$) of the at least one second trench 116 relative to the first depth ($d_1$) of the at least first trench 106. Based on the inventors' empirical finding, the dominating effect of the actual processing temperature on the depth parameter (t) may be explained using the schematic illustration 500 in FIG. 8.

Figure 8:
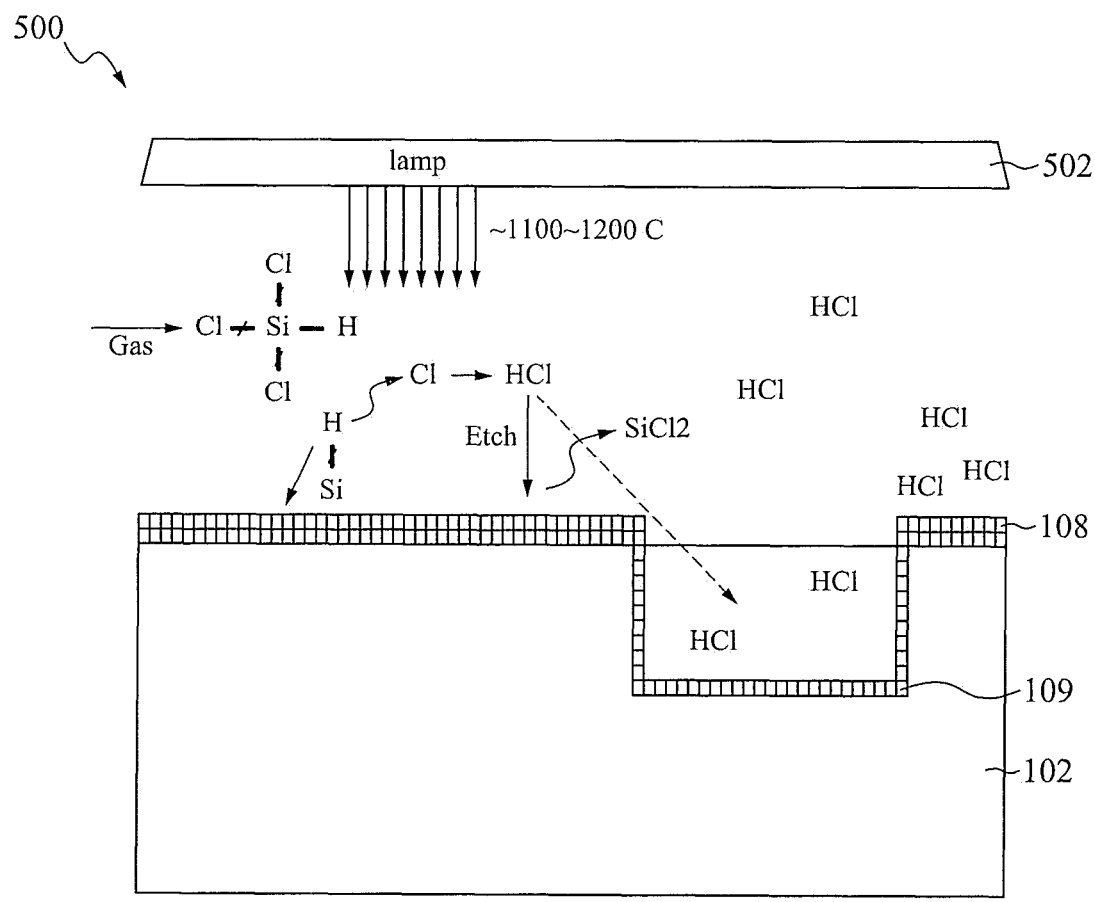
FIG. 8 is a schematic illustration showing an exemplary process of chemical vapor deposition (CVD) for epitaxial growth of silicon on a semiconductor substrate defining at least one trenches therein in some embodiments.

Referring to FIG. 8, the schematic illustration 500 shows an exemplary process of CVD for epitaxial growth of silicon on a semiconductor substrate 102 in some embodiments.

When the silicon-containing precursor TCS is heated at an elevated temperature (e.g., about 1100-1200° C.), TCS reacts with hydrogen to deposit silicon. Meanwhile, the by-product HCl from the reaction between TCS and hydrogen can etch away the silicon deposited.

When the actual processing temperature is relatively low during the CVD process, it is harder for the by-product HCl to diffuse into the trench 106, thus deposition of silicon dominates. A shallower trench 116, with a lower depth parameter (t) (i.e. $d_2$ relative to $d_1$), is produced after the coating layer 108 is deposited. However, when the actual processing temperature is relatively high during the CVD process, the by-product HCl can diffuse into the trench 106 to etch the deposited silicon, thus results in a deeper trench 116, with a greater depth parameter (t) (i.e. $d_2$ relative to $d_1$). Therefore, the depth parameter (t) (i.e. $d_2$ relative to $d_1$) can be used to calibrate the actual processing temperature.

At process 60 of FIG. 2A, a pre-determined standard reference curve is generated. Process 60 is optional in the exemplary method 50. The standard reference curve may be established before any calibration. Process 60 may also include processes 52, 54 and 56 or the like in a process of establishing the standard reference curve. In some embodiments, the standard reference curve is established once as a universal tool. The standard reference curve may be established in several experiments, in which each actual processing temperature is measured to provide the relationship between the depth parameter (t) and processing temperature. Process 60 is not repeated during semiconductor fabrication processes.

Referring to FIG. 2B, an exemplary method for generating a pre-determined standard reference curve (process 60) may comprise two sub-processes (or sub-steps) such as 62 and 64 in accordance with some embodiments.

At process 62, a plurality of reference coating layers 108 is deposited through CVD using the at least one precursor at the plurality of processing temperatures, which is controlled and measured. The plurality of reference coating layers 108 have a plurality of depth parameters (t) in a first range (e.g., 50-300 nm, or 100-200 nm). The plurality of processing temperatures are in the second range (e.g., 1,000-1,500° C., 1,100-1,200° C.).

Figure 9:
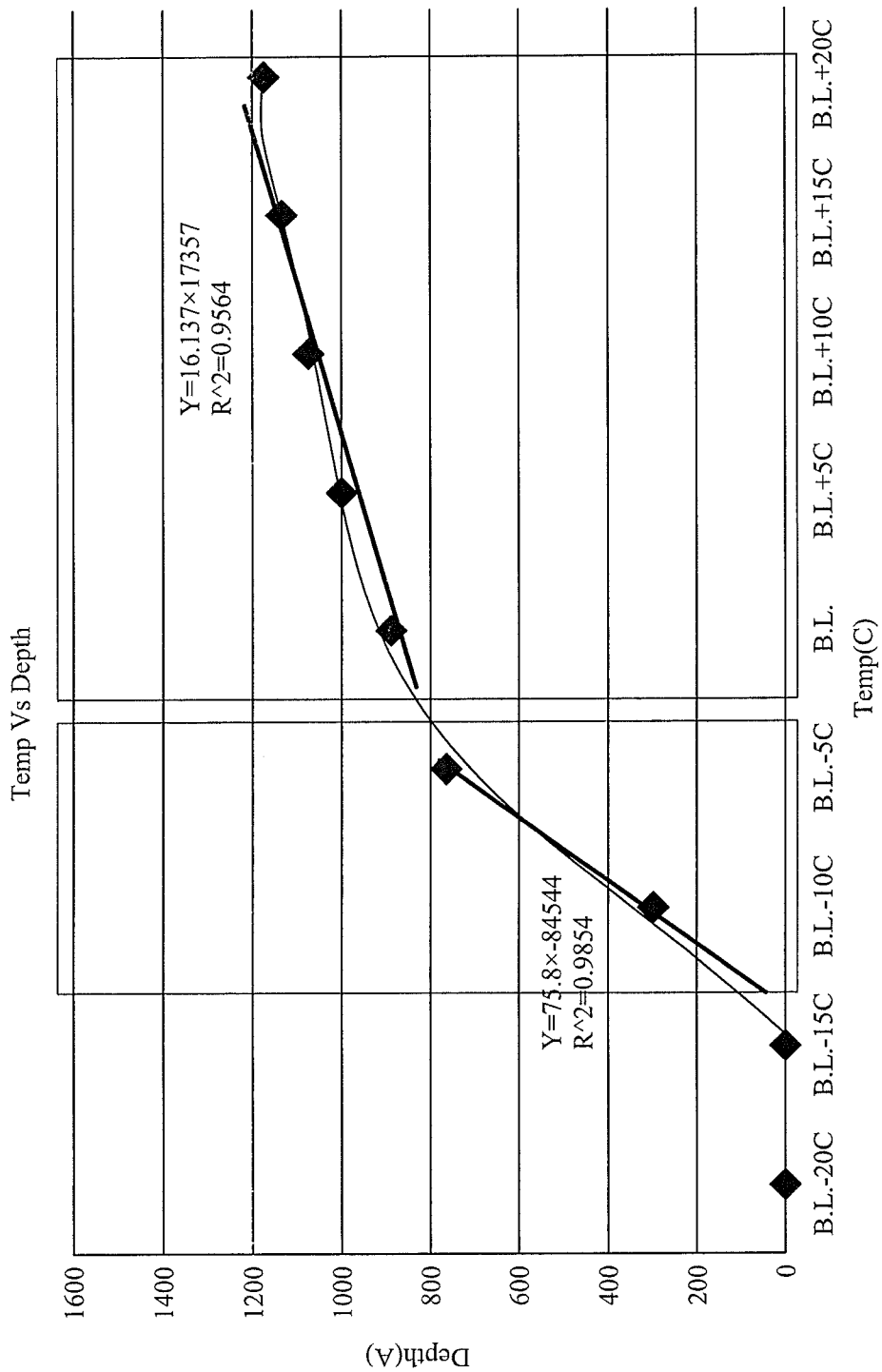
FIG. 9 illustrates an exemplary pre-determined standard reference curve in accordance with some embodiments.

At process 64, the plurality of depth parameters (t) in the first range is plotted as the function of the plurality of processing temperatures to provide a standard reference curve. FIG. 9 illustrates an exemplary pre-determined standard reference curve for epitaxial growth of silicon through CVD using TCS and hydrogen in accordance with some embodiments. In this standard reference curve of FIG. 9, the first depth ($d_1$) is fixed (about 1,500 Angstroms), and the depth parameter (t) is represented by the second depth ($d_2$).

At process 70 of FIG. 2A, the processing temperature (T) in a CVD process at process 54 is then determined based on the pre-determined standard reference curve comprising a plurality of references depth parameters in the first range as a function of a plurality of reference processing temperatures in a second range. In one experimental run, after a respective depth parameters (t) is obtained, the actual processing temperature is determined corresponding to the the respective depth parameter (t) on the pre-determined standard reference curve. Extrapolation of the pre-determined standard reference curve beyond the first and the second ranges may be optionally used. When a sample contains a plurality of trenches 106 and 116, an average processing temperature can be obtained. In some embodiments, the temperature at different locations and a temperature distribution can be mapped out corresponding to the semiconductor substrate 102.

At process 72, in some embodiments, the setting for temperature is changed to adjust the actual processing temperature to a desired level after process 70 based on the results obtained in process 70. The actual processing temperature and its uniformity are adjusted to provide the desired deposition rate and morphology of the coating layer 108 having excellent quality.

The present disclosure provides a method for semiconductor processing. Such a method comprises the following processes. A semiconductor substrate is provided. The semiconductor substrate defines at least one first trench therein. The at least one first trench has a first depth ($d_1$). A coating layer is deposited onto the semiconductor substrate through chemical vapor deposition (CVD), for example, using at least one precursor under a setting for a processing temperature (T). The coating layer fills the at least one first trench, and defines at least one second trench having a second depth ($d_2$) above the at least one first trench. A depth parameter (t) of the second depth ($d_2$) relative to the first depth ($d_1$) is determined. The method further comprises a process of determining the processing temperature (T) based on a pre-determined standard reference curve comprising a plurality of references depth parameters in a first range as a function of a plurality of reference processing temperatures in a second range.

In some embodiments, the coating layer comprises silicon formed through epitaxial growth. The at least one precursor may comprise any suitable chemicals including at least one silicon-containing precursor. For example, in some embodiments, the at least one precursor comprises trichlorosilane and hydrogen.

In some embodiments, the depth parameter (t) is the difference between the second depth ($d_2$) and the first depth ($d_1$). Alternatively, the depth parameter (t) may be represented by the second depth ($d_2$), wherein the first depth ($d_1$) is a fixed value.

The method may further comprise a process of generating the pre-determined standard reference curve. In some embodiments, the process of generating the pre-determined standard reference curve comprises at least two sub-steps. First, a plurality of reference coating layers having the plurality of depth parameters in the first range is deposited through CVD using the at least one precursor at the plurality of processing temperatures in the second range. Second, the plurality of depth parameters in the first range is plotted as the function of the plurality of processing temperatures in the second range.

In some embodiments, the process of providing the semiconductor substrate defining the at least one first trench therein comprises etching the semiconductor substrate to define a plurality of first trenches. In some embodiments, the at least one first trench has a width in a range of from about 5 microns to about 20 microns (e.g., from 7 microns to 10 microns), and the first depth in a range of from about 50 nanometers to about 300 nanometers (e.g., from 100 nm to 200 nm).

The coating layer may be deposited onto the semiconductor substrate at a fixed pressure and a fixed feeding rate of the at least one precursor for a fixed period of time. In some embodiments, the method further comprises changing the setting to adjust the processing temperature to a desired level after the process of determining the processing temperature (T) based on the pre-determined standard reference curve.

In some embodiments, a method provided in the present disclosure comprises the following processes. A semiconductor substrate is etched to define at least one first trench (e.g., a plurality of first trenches) therein. The at least one first trench has a first depth ($d_1$). A coating layer is deposited onto the semiconductor substrate through CVD using at least one precursor under a setting for a processing temperature (T). The coating layer defines at least one second trench having a second depth ($d_2$) above the at least one first trench. A depth parameter (t) of the second depth ($d_2$) relative to the first depth ($d_1$) is then calculated. The depth parameter (t) is the difference between the second depth ($d_2$) and the first depth ($d_1$). The processing temperature (T) is determined based on a pre-determined standard reference curve comprising a plurality of references depth parameters in a first range as a function of a plurality of reference processing temperatures in a second range. The coating layer comprises silicon formed through epitaxial growth, and the at least one precursor comprises trichlorosilane and hydrogen. In some embodiments, the coating layer is deposited onto the semiconductor substrate at a fixed pressure and a fixed feeding rate of the at least one precursor for a fixed period of time. The method may further comprise changing the setting to adjust the processing temperature to a desired level after the process of determining the processing temperature (T) based on the pre-determined standard reference curve.

In some embodiments, a method provided in the present disclosure comprises the following processes. A semiconductor substrate is etched to define at least one first trench (e.g., a plurality of first trenches) therein. The at least one first trench has a first depth ($d_1$). A coating layer is deposited onto the semiconductor substrate through CVD using at least one precursor under a setting for a processing temperature (T). The coating layer defines at least one second trench having a second depth ($d_2$) above the at least one first trench. A depth parameter (t) of the second depth ($d_2$) relative to the first depth ($d_1$) is then determined. In some embodiments, the first depth ($d_1$) is a fixed value, and the depth parameter (t) is represented by the second depth ($d_2$). The method further comprises determining the processing temperature (T) based on a pre-determined standard reference curve. The standard reference curve comprises a plurality of references depth parameters in a first range as a function of a plurality of reference processing temperatures in a second range. The coating layer comprises silicon formed through epitaxial growth, and the at least one precursor comprises trichlorosilane and hydrogen. In some embodiments, the method further comprises changing the setting to adjust the processing temperature to a desired level after the process of determining the processing temperature (T) based on the pre-determined standard reference curve.

The methods and system described herein may be at least partially embodied in the form of computer-implemented processes and apparatus for practicing those processes. The disclosed methods may also be at least partially embodied in the form of tangible, non-transient machine readable storage media encoded with computer program code. The media may include, for example, RAMs, ROMs, CD-ROMs, DVD-ROMs, BD-ROMs, hard disk drives, flash memories, or any other non-transient machine-readable storage medium, or any combination of these mediums, wherein, when the computer program code is loaded into and executed by a computer, the computer becomes an apparatus for practicing the method. The methods may also be at least partially embodied in the form of a computer into which computer program code is loaded and/or executed, such that, the computer becomes an apparatus for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor substrate defining at least one first trench therein, the at least one first trench having a first depth ($d_1$);
   depositing a coating layer onto the semiconductor substrate using at least one precursor under a setting for a processing temperature (T), the coating layer defining at least one second trench having a second depth ($d_2$) above the at least one first trench;
   determining a depth parameter (t) of the second depth ($d_2$) relative to the first depth ($d_1$); and
   determining the processing temperature (T) based on a pre-determined standard reference curve comprising a plurality of reference depth parameters in a first range as a function of a plurality of reference processing temperatures in a second range.

2. The method of claim 1, wherein the depth parameter (t) is a difference between the second depth ($d_2$) and the first depth ($d_1$).

3. The method of claim 1, wherein the depth parameter (t) is represented by the second depth ($d_2$), wherein the first depth ($d_1$) is a fixed value.

4. The method of claim 1, further comprising:
   generating the pre-determined standard reference curve.

5. The method of claim 4, wherein the generating the pre-determined standard reference curve comprises:
   depositing a plurality of reference coating layers having the plurality of depth parameters in the first range using the at least one precursor at the plurality of processing temperatures in the second range; and
   plotting the plurality of depth parameters in the first range as the function of the plurality of processing temperatures in the second range.

6. The method of claim 1, wherein the coating layer comprises silicon formed through epitaxial growth.

7. The method of claim 1, wherein the at least one precursor comprises trichlorosilane and hydrogen.

8. The method of claim 1, wherein the providing the semiconductor substrate defining the at least one first trench therein comprises etching the semiconductor substrate to define a plurality of first trenches.

9. The method of claim 1, wherein the coating layer is deposited onto the semiconductor substrate at a fixed pressure and a fixed feeding rate of the at least one precursor for a fixed period of time.

10. The method of claim 1, wherein the at least one first trench has a width in a range of from about 5 microns to about 20 microns, and the first depth in a range of from about 50 nanometers to about 300 nanometers.

11. The method of claim 1, further comprises changing the setting to adjust the processing temperature to a desired level after the determining the processing temperature (T) based on the pre-determined standard reference curve.

12. A method, comprising:
etching a semiconductor substrate to define at least one first trench therein, the at least one first trench having a first depth ($d_1$);
depositing a coating layer onto the semiconductor substrate using at least one precursor under a setting for a processing temperature (T), the coating layer defining at least one second trench having a second depth ($d_2$) above the at least one first trench;
calculating a depth parameter (t) of the second depth ($d_2$) relative to the first depth ($d_1$), the depth parameter (t) is a difference between the second depth ($d_2$) and the first depth ($d_1$); and
determining the processing temperature (T) based on a pre-determined standard reference curve comprising a plurality of reference depth parameters in a first range as a function of a plurality of reference processing temperatures in a second range,
wherein the method is for calibrating or controlling the processing temperature in a chemical vapor deposition process.

13. The method of claim 12, wherein the coating layer comprises silicon formed through epitaxial growth, and the at least one precursor comprises trichlorosilane and hydrogen.

14. The method of claim 12, wherein the semiconductor substrate is etched to define a plurality of first trenches.

15. The method of claim 12, wherein the coating layer is deposited onto the semiconductor substrate at a fixed pressure and a fixed feeding rate of the at least one precursor for a fixed period of time.

16. The method of claim 12, further comprises changing the setting to adjust the processing temperature to a desired level after determining the processing temperature (T) based on the pre-determined standard reference curve.

17. A method, comprising:
etching a semiconductor substrate to define at least one first trench therein, the at least one first trench having a first depth ($d_1$);
depositing a coating layer onto the semiconductor substrate using at least one precursor under a setting for a processing temperature (T), the coating layer defining at least one second trench having a second depth ($d_2$) above the at least one first trench;
determining a depth parameter (t) of the second depth ($d_2$) relative to the first depth ($d_1$), wherein the first depth ($d_1$) is a fixed value and the depth parameter (t) is represented by the second depth ($d_2$); and
determining the processing temperature (T) based on a pre-determined standard reference curve comprising a plurality of references depth parameters in a first range as a function of a plurality of reference processing temperatures in a second range,
wherein the method is for calibrating or controlling the processing temperature in a chemical vapor deposition process.

18. The method of claim 17, wherein the coating layer comprises silicon formed through epitaxial growth, and the at least one precursor comprises trichlorosilane and hydrogen.

19. The method of claim 17, wherein the semiconductor substrate is etched to define a plurality of first trenches.

20. The method of claim 17, further comprises changing the setting to adjust the processing temperature to a desired level after determining the processing temperature (T) based on the pre-determined standard reference curve.

* * * * *